(12) United States Patent
Ozawa

(10) Patent No.: US 8,267,733 B2
(45) Date of Patent: Sep. 18, 2012

(54) METHOD OF MANUFACTURING DISPLAY UNIT USING LASER REMOVAL OF ORGANIC MATERIAL

(75) Inventor: Nobuo Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 12/121,919

(22) Filed: May 16, 2008

(65) Prior Publication Data

US 2008/0287028 A1 Nov. 20, 2008

(30) Foreign Application Priority Data

May 18, 2007 (JP) ................. 2007-132824

(51) Int. Cl.
*H01J 1/62* (2006.01)
*H01J 63/04* (2006.01)
*H01J 17/49* (2012.01)

(52) U.S. Cl. ............... 445/24; 445/1; 445/25; 313/483; 313/500; 313/506; 313/505; 313/504; 313/503; 313/502

(58) Field of Classification Search ........................ None
See application file for complete search history.

(56) References Cited

U.S. PATENT DOCUMENTS

| | | | |
|---|---|---|---|
| 6,815,240 B2 * | 11/2004 | Hayashi | 438/30 |
| 6,995,035 B2 * | 2/2006 | Cok et al. | 438/82 |
| 7,648,944 B2 * | 1/2010 | Matsuo et al. | 503/227 |
| 7,666,707 B2 * | 2/2010 | Nakayama et al. | 438/99 |
| 2003/0082889 A1 * | 5/2003 | Maruyama et al. | 438/455 |

FOREIGN PATENT DOCUMENTS

| | | |
|---|---|---|
| JP | 2005-011810 | 1/2005 |
| JP | 2006-286493 | 10/2006 |
| JP | 2006-309994 | 11/2006 |
| JP | 2007-103098 | 4/2007 |

OTHER PUBLICATIONS

English machine translation of Kurauchi et al. (JP 2007-103098).*

Office Action issued by the Japanese Patent Office on Apr. 30, 2009 in connection to related Japanese Patent Application No. 2007-126506.

* cited by examiner

*Primary Examiner* — Natalie Walford
(74) *Attorney, Agent, or Firm* — SNR Denton US LLP

(57) ABSTRACT

A laminated structure is formed by placing a cover substrate over a device substrate with a projection structure in between in the vacuum atmosphere. Next, the laminated structure is taken out into the air in a state that a space between the device substrate and the cover substrate is maintained in the vacuum atmosphere. Subsequently, the portion of the organic layer formed on the auxiliary electrode is removed by irradiating laser light to the laminated structure. Since the space between the device substrate and the cover substrate is maintained in the vacuum atmosphere, even if the laser light is emitted to the laminated structure taken out into the air, the laser light is emitted to the portion of the organic layer formed on the auxiliary electrode in the vacuum atmosphere.

3 Claims, 15 Drawing Sheets

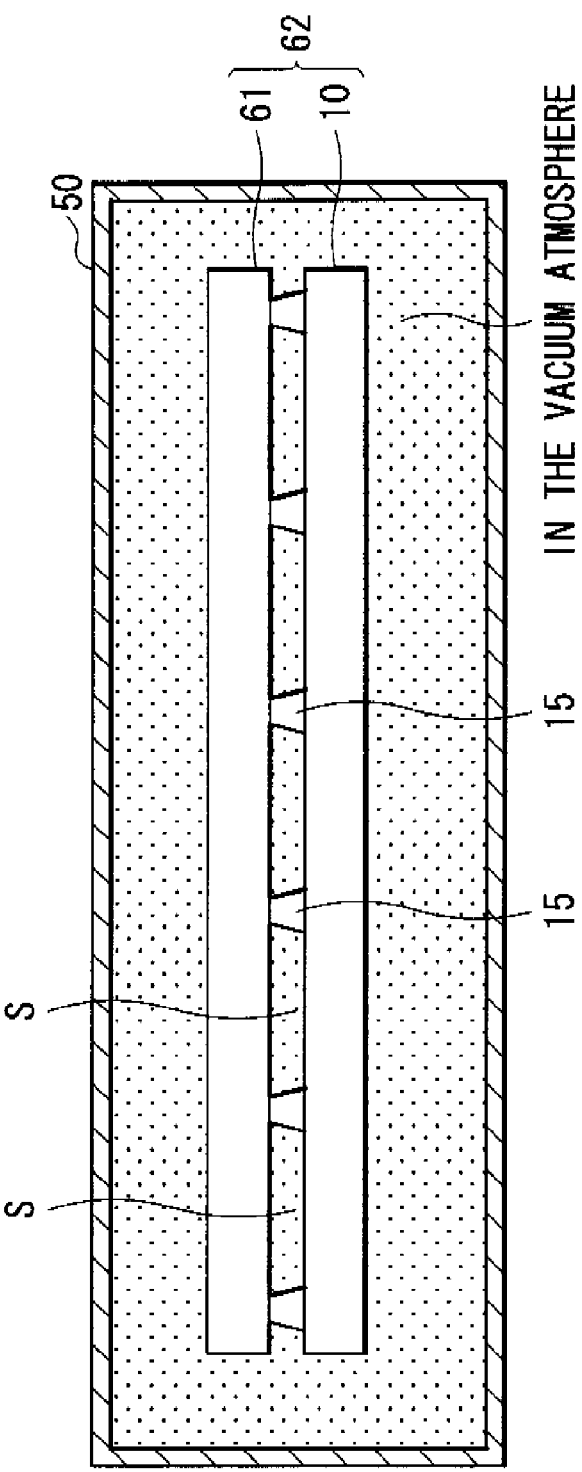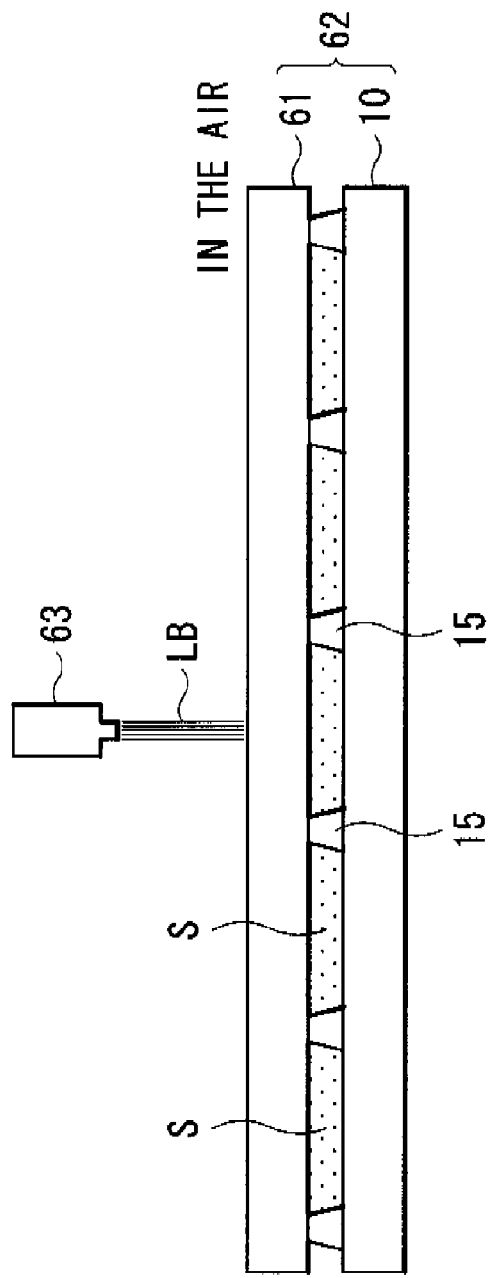
FIG. 8A
FIG. 8B

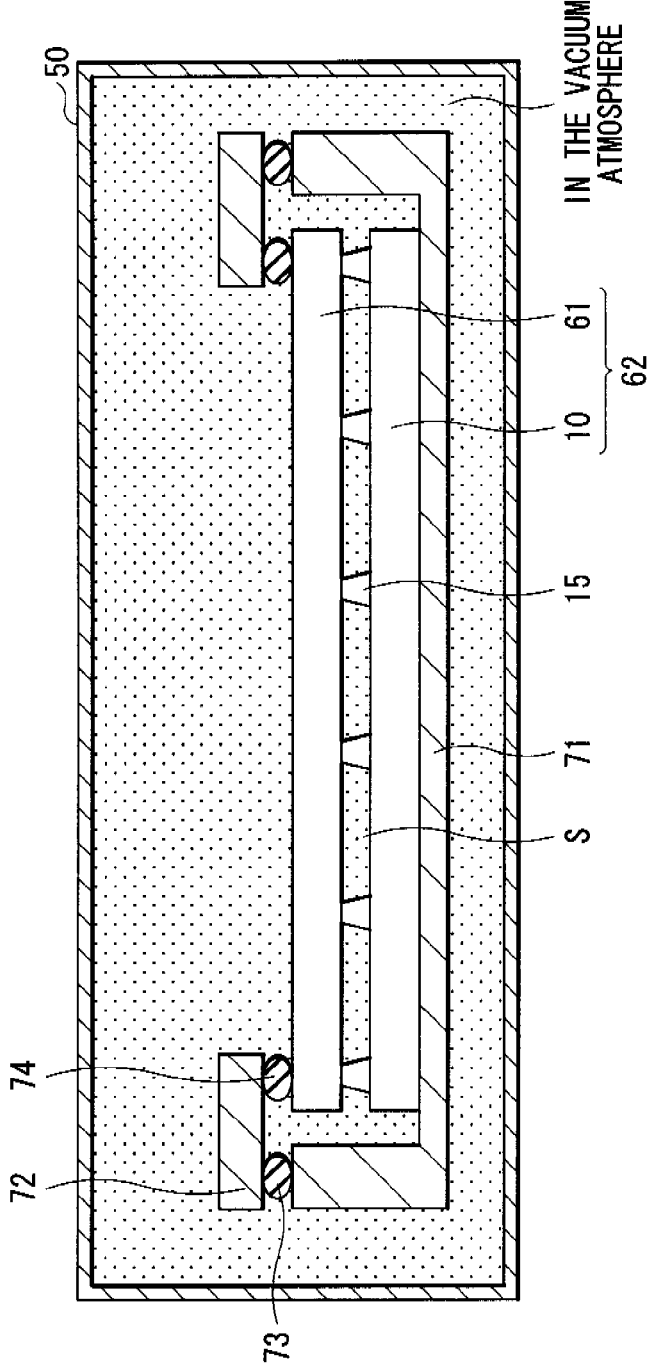
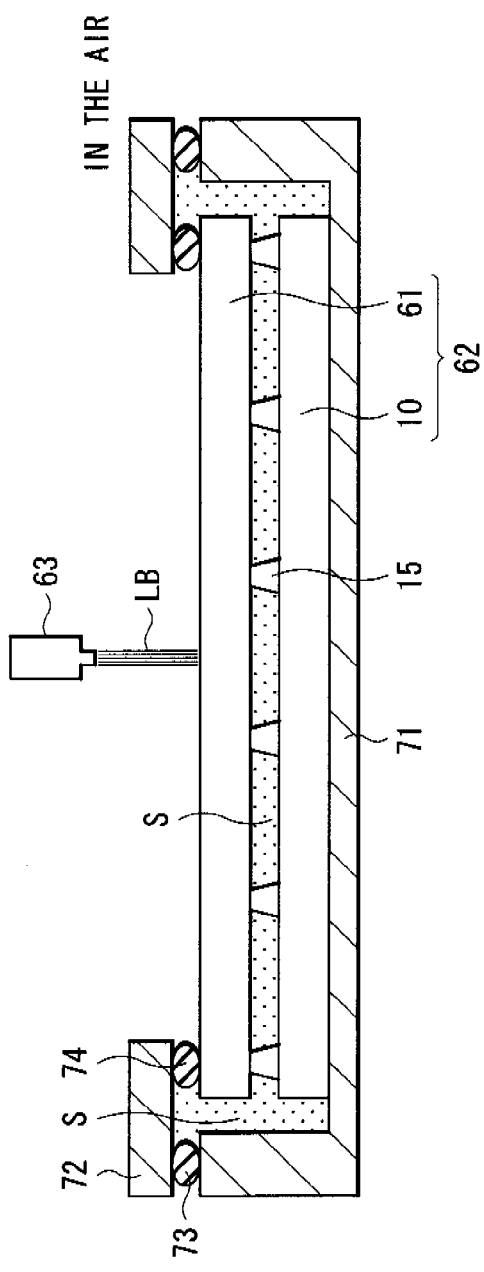
FIG. 9A
FIG. 9B

METHOD OF MANUFACTURING DISPLAY UNIT USING LASER REMOVAL OF ORGANIC MATERIAL

CROSS REFERENCES TO RELATED APPLICATIONS

The present invention contains subject matter related to Japanese Patent Application JP 2007-132824 filed in the Japanese Patent Office on May 18, 2007, the entire contents of which being incorporated herein by reference.

BACKGROUND OF THE INVENTION

1. Field of the Invention

The present invention relates to a method of manufacturing a display unit including an organic light emitting device.

2. Description of the Related Art

As such a kind of display unit, for example, as shown in FIG. 21, a display unit in which a first electrode 813 is formed on a substrate 811 for every organic light emitting device, and thereon an organic layer 816 including a light emitting layer and a second electrode 817 are sequentially layered is known. Since the second electrode 817 is a thin film common electrode, the resistance value is high, and the voltage drop is different according to each distance from a power source (not shown) to each organic light emitting device. Thereby, luminance variation may be generated in the screen. To inhibit such luminance variation, in some cases, a relatively thick auxiliary electrode 814 is provided in a region between each first electrode 813, and the auxiliary electrode 814 and the second electrode 817 are electrically connected.

To electrically connect the second electrode 817 to the auxiliary electrode 814, it is necessary to remove a portion of the organic layer 816 formed on the auxiliary electrode 814 before forming the second electrode 817. In some cases, the organic layer 816 is formed only on the first electrode 813 by using a mask or the like. In other cases, the organic layer 816 is formed on almost the whole area of the display region of the substrate 810. In any cases, there is a possibility that the auxiliary electrode 814 is covered with the organic layer 816.

In the past, for example, Japanese Unexamined Patent Application Publication No. 2005-11810 describes that it is desirable to remove the portion of the organic layer formed on the auxiliary electrode by laser irradiation in a chamber maintained under reduced pressure.

SUMMARY OF THE INVENTION

However, in Japanese Unexamined Patent Application Publication No. 2005-11810, there is no description for a method of maintaining the vacuum atmosphere.

In general, as a method of irradiating laser light in a vacuum chamber, the following methods are possibly used. In one of the methods, an airtight opening (glass window) for transmitting laser light is arranged in the vacuum chamber, and the laser light is emitted from outside of the chamber. In another method, a laser light source and an operating section thereof are arranged in the chamber, and thereby laser light is emitted. However, in the foregoing methods, when a large substrate is used as a substrate on which the organic light emitting device is provided, the glass window of the vacuum chamber is jumboized and therefore it has been difficult to realize such arrangement in terms of equipment. Further, in the foregoing methods, the configuration of the vacuum chamber, the laser light source, and the operating section thereof are complicated and grows in size, and the increased equipment cost has been an issue.

As described above, in the past, a method of removing the portion of the organic layer formed on the auxiliary electrode by laser irradiation in the vacuum atmosphere has not been yet developed.

In view of the foregoing, in the invention, it is desirable to provide a method of manufacturing a display unit capable of removing the portion of the organic layer formed on the auxiliary electrode by laser irradiation in the vacuum atmosphere.

According to an embodiment of the invention, there is provided a method of manufacturing a display unit having a plurality of organic light emitting devices on a substrate. The method of manufacturing a display unit includes the steps of: forming a plurality of first electrodes, an auxiliary electrode in a region between the plurality of first electrodes, a projection structure made of an insulating material in a region between the plurality of first electrodes and the auxiliary electrode, and an organic layer covering the plurality of first electrodes and the auxiliary electrode over the substrate, and thereby forming a device substrate; selectively removing a portion of the organic layer formed on the auxiliary electrode; and forming a second electrode on the organic layer and the auxiliary electrode. The step of selectively removing the portion of the organic layer formed on the auxiliary electrode includes the following steps A to C:

A: a step of forming a laminated structure by placing a cover substrate over device substrate with the projection structure in between in the vacuum atmosphere, B: a step of taking out the laminated structure into the air in a state that at least a space between the cover substrate and the portion of the organic layer formed on the auxiliary electrode is maintained in the vacuum atmosphere, and C: a step of irradiating laser light to the laminated structure.

In the method of manufacturing a display unit according to the embodiment of the invention, the projection structure has a function as a spacer between the device substrate and the cover substrate. Therefore, even in the state that the device substrate is laminated over the cover substrate, the space is generated between the device substrate and the cover substrate. The space may be maintained in the vacuum atmosphere even if the laminated structure is taken out into the air. Even if the laser light is emitted to the laminated structure taken out into the air, the laser light is emitted to the portion of the organic layer formed on the auxiliary electrode in the vacuum atmosphere.

According to the method of manufacturing a display unit of the embodiment of the invention, in the step of selectively removing the portion of the organic layer formed on the auxiliary electrode, the device substrate is laminated over the cover substrate with the projection structure in between in the vacuum atmosphere and thereby the laminated structure is formed; the laminated structure is taken out into the air in the state that at least the space between the cover substrate and the portion of the organic layer formed on the auxiliary electrode is maintained in the vacuum atmosphere; and then the laser light is emitted to the laminated structure. Therefore, the portion of the organic layer formed on the auxiliary electrode may be removed by laser irradiation in the vacuum atmosphere.

Other and further objects, features and advantages of the invention will appear more fully from the following description.

BRIEF DESCRIPTION OF THE DRAWINGS

FIGS. 8A and 8B are views for explaining an example of a step following FIG. 7;

FIGS. 9A and 9B are views for explaining another example of a step following FIG. 7;

DETAILED DESCRIPTION OF THE PREFERRED EMBODIMENT

An embodiment of the invention will be hereinafter described in detail with reference to the drawings.

Figure 1:
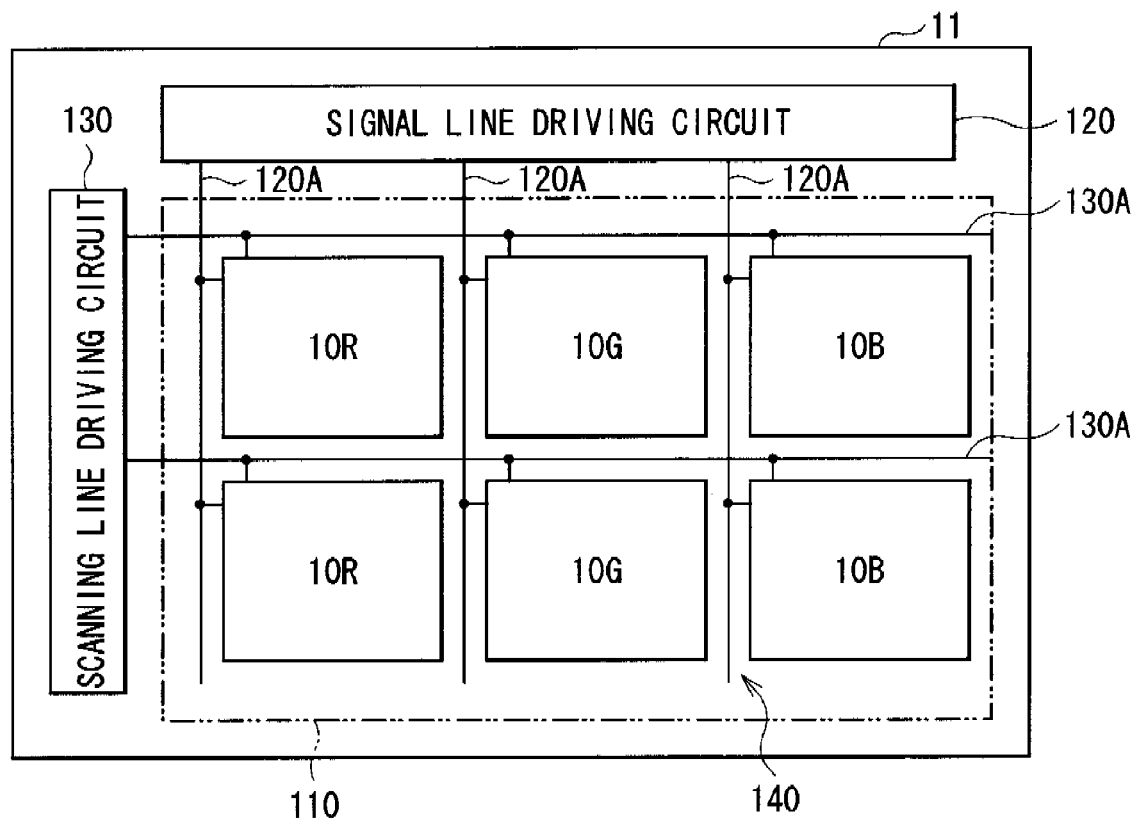
FIG. 1 is a diagram showing a configuration of a display unit according to an embodiment of the invention.

FIG. 1 shows a configuration of a display unit according to an embodiment of the invention. The display unit is used as an ultrathin organic light emitting color display unit or the like. In the display unit, for example, a display region 110 in which a plurality of organic light emitting devices 10R, 10G, and 10B described later are arranged in a matrix state is formed on a substrate 11 made of glass. A signal line driving circuit 120 and a scanning line driving circuit 130 that are drivers for displaying an image are formed on the periphery of the display region 110.

Figure 2:
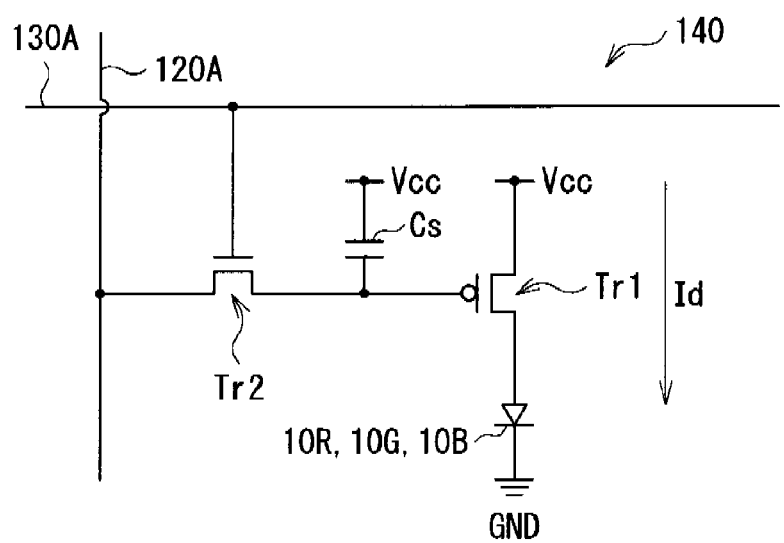
FIG. 2 is a diagram showing an example of the pixel driving circuit shown in FIG. 1.

In the display region 110, a pixel driving circuit 140 is formed. FIG. 2 shows an example of the pixel driving circuit 140. The pixel driving circuit 140 is formed in a layer under a first electrode 13 described later. The pixel driving circuit 140 is an active driving circuit having a driving transistor Tr1, a writing transistor Tr2, a capacitor (retention volume) Cs between the driving transistor Tr1 and the writing transistor Tr2, and the organic light emitting device 10R (or 10G, 10B) serially connected to the driving transistor Tr1 between a first power line (Vcc) and a second power line (GND). The driving transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

In the pixel driving circuit 140, a plurality of signal lines 120A are arranged in the column direction, and a plurality of scanning lines 130A are arranged in the row direction. Each intersect between each signal line 120A and each scanning line 130A corresponds to one of the organic light emitting devices 10R, 10G, and 10B (sub pixel). Each signal line 120A is connected to the signal line driving circuit 120. An image signal is supplied to a source electrode of the writing transistor Tr2 from the signal line driving circuit 120 through the signal line 120A. Each scanning line 130A is connected to the scanning line driving circuit 130. A scanning signal is sequentially supplied to a gate electrode of the writing transistor Tr2 from the scanning line driving circuit 130 through the scanning line 130A.

Figure 3:
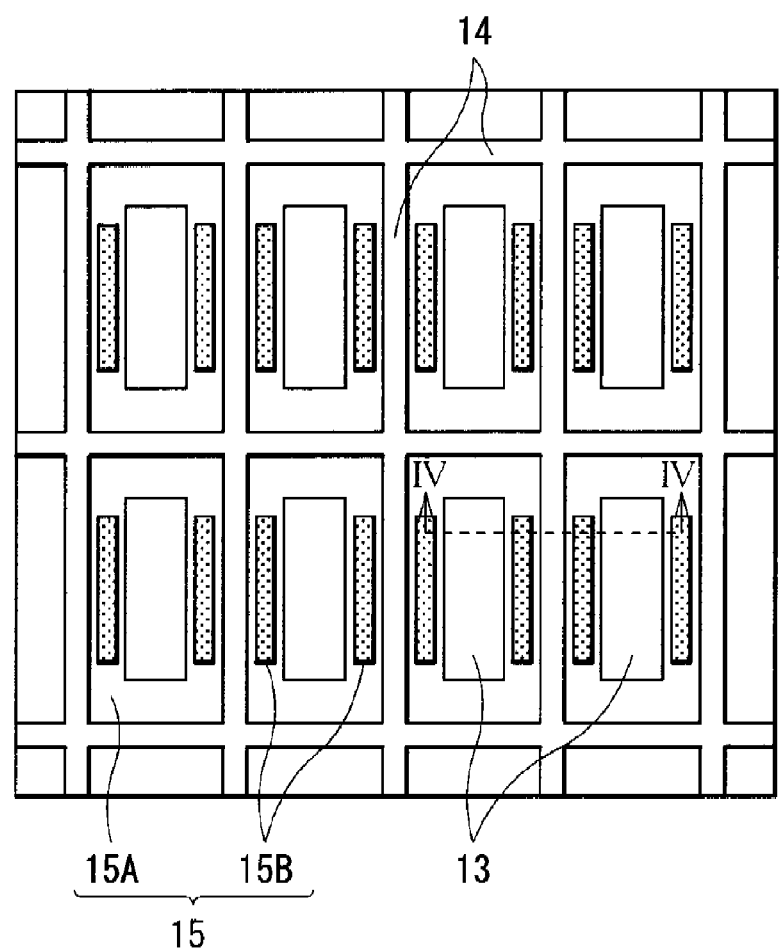
FIG. 3 is a plan view showing a structure of the display region shown in FIG. 1.

FIG. 3 shows an example of a planar structure of the display region 110. In the display region 110, the organic light emitting device 10R generating red light, the organic light emitting device 10G generating green light, and the organic light emitting device 10B generating blue light are sequentially provided in a matrix state as a whole. The organic light emitting devices 10R, 10G, and 10B have reed-shaped planar shape, and a combination of the organic light emitting devices 10R, 10G, and 10B adjacent to each other composes one pixel.

Figure 4:
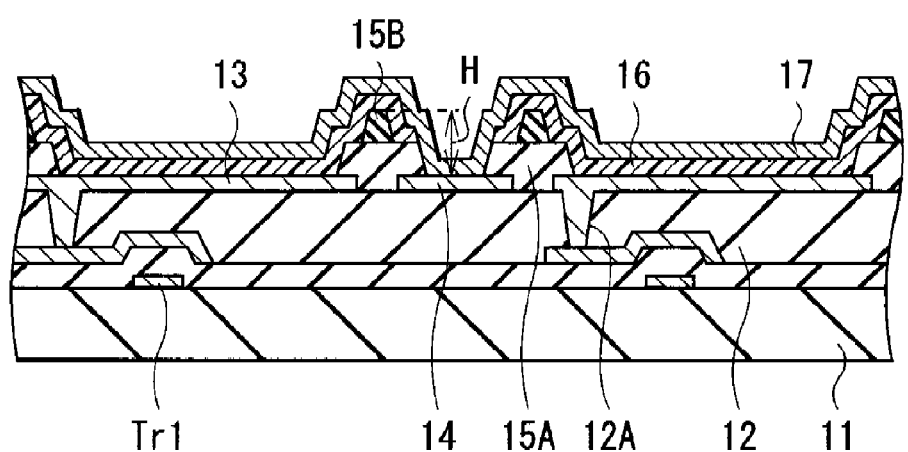
FIG. 4 is a cross section showing a structure of the organic light emitting device shown in FIG. 3.

FIG. 4 shows a cross sectional structure of the organic light emitting devices 10R, 10G, and 10B shown in FIG. 3. In the organic light emitting devices 10R, 10G, and 10B, the foregoing driving transistor Tr1 of the pixel driving circuit 140, a planarizing insulating film 12, the first electrode 13 as an anode, an auxiliary electrode 14, a projection structure 15 made of an insulating material, an organic layer 16 including a light emitting layer described later, and a second electrode 17 as a cathode are layered in this order from the substrate 11 side.

The organic light emitting devices 10R, 10G, and 10B as above are coated with a protective film (not shown) made of silicon nitride (SiN), silicon oxide (SiO) or the like according to need. Further, a sealing substrate (not shown) made of glass or the like is bonded to over the whole area of the protective film with an adhesive layer (not shown) made of a thermoset resin, an ultraviolet cure resin or the like in between, and thereby the organic light emitting devices 10R, 10G, and 10B are sealed.

The driving transistor Tr1 is electrically connected to the first electrode 13 through a connection hole 12A provided in the planarizing insulating film 12.

The planarizing insulating film 12 is intended to planarize a front face of the substrate 11 formed with the pixel driving circuit 140. Since the fine connection hole 12A is formed in the planarizing insulating film 12, the planarizing insulating film 12 is preferably made of a material having favorable pattern precision. As a material of the planarizing insulating film 12, for example, an organic material such as polyimide, an inorganic material such as silicon oxide ($SiO_2$) or the like is cited.

The first electrode 13 is formed correspondingly to the respective organic light emitting devices 10R, 10G, and 10B. Further, the first electrode 13 has a function as a reflecting electrode to reflect light generated in the light emitting layer, and desirably has high reflectance as much as possible in order to improve light emitting efficiency. The first electrode 13 is, for example, from 100 nm to 1000 nm thick, and is made of a simple substance or an alloy of metal elements such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), and gold (Au).

The auxiliary electrode 14 is intended to prevent large difference in voltage drop according to the distance from a power source (not shown) to the respective organic light emitting devices 10R, 10G, and 10B and thereby inhibit in-plane luminance variation. The auxiliary electrode 14 is formed in a region between each first electrode 13. Further, the auxiliary electrode 14 is electrically insulated from the first electrode 13 by the projection structure 15, and is electrically connected to the second electrode 17. That is, the top face of the auxiliary electrode 14 is not covered with the organic layer 16, and such an exposed portion is a contact region with the second electrode 17. It is desirable that the entire top face of the auxiliary electrode 14 is electrically connected to the second electrode 17. However, at least part of the top face of the auxiliary electrode 14 may be electrically connected to the second electrode 17.

The auxiliary electrode 14 is made of, for example, a simple substance or an alloy of metal elements such as silver (Ag), aluminum (Al), chromium (Cr), titanium (Ti), iron (Fe), cobalt (Co), nickel (Ni), molybdenum (Mo), copper (Cu), tantalum (Ta), tungsten (W), platinum (Pt), and gold (Au). The auxiliary electrode 14 may be made of the same material as that of the first electrode 13, or may be made of a different material. Further, the auxiliary electrode 14 is desirably made of a material having high absorbency to the after-mentioned laser light.

The projection structure 15 is formed in a region between the first electrode 13 and the auxiliary electrode 14. The projection structure 15 has a function as an interelectrode insulating film to secure insulation properties between the first electrode 13 and the auxiliary electrode 14/the second electrode 17 and to accurately obtain a desired shape of the light emitting region. The projection structure 15 is made of, for example, an organic material such as polyimide or an inorganic insulating material such as oxide silicon ($SiO_2$), and has an opening correspondingly to the light emitting region of the first electrode 13 and the auxiliary electrode 14. The organic layer 16 and the second electrode 17 may be sequentially provided on the projection structure 15 as well in addition to the light emitting region. However, light emission is generated only in the opening of the projection structure 15 corresponding to the first electrode 13.

The projection structure 15 also has a function to secure space S between a cover substrate 61 and a portion of the organic layer 16 formed on the auxiliary electrode 14 as a spacer to the cover substrate 61 when the portion of the organic layer 16 formed on the auxiliary electrode 14 is selectively removed in the after-mentioned manufacturing step. To that end, height H of the projection structure 15 is preferably, for example, 2 μm or more from the front face of the first electrode 13 and the front face of the auxiliary electrode 14.

Figure 5:
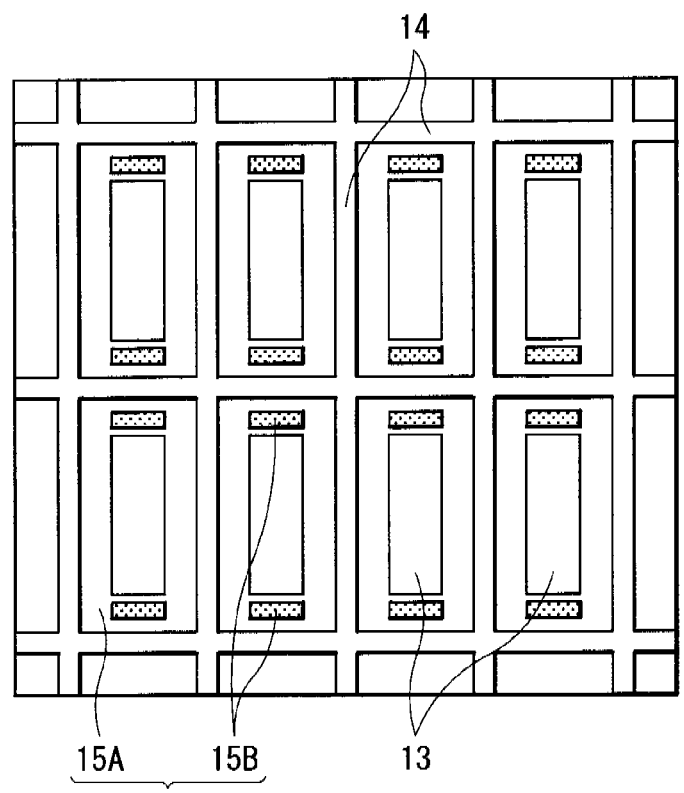
FIG. 5 is a plan view showing another structure of the display region shown in FIG. 3.
Figure 6:
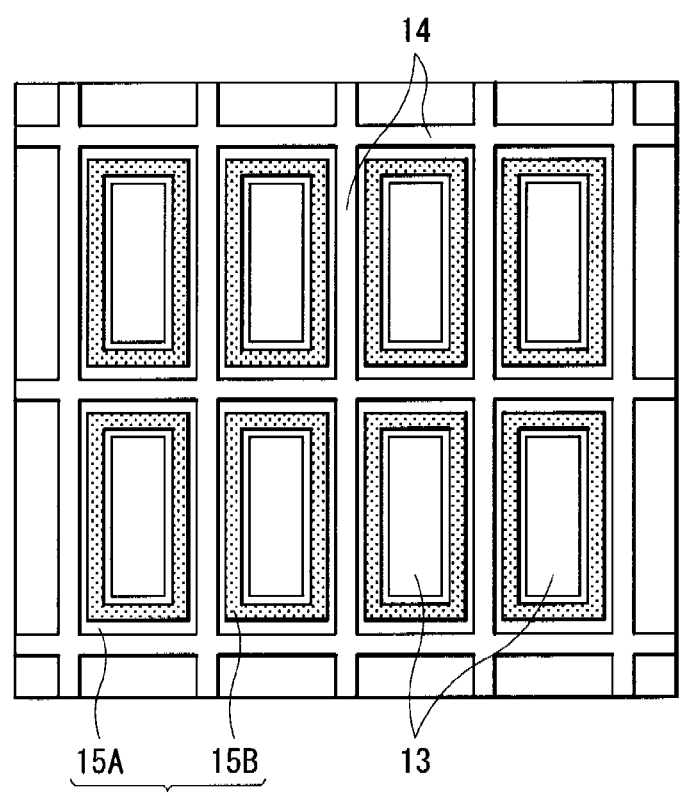
FIG. 6 is a plan view showing still another structure of the display region shown in FIG. 3.

The projection structure 15 has a two-stage structure composed of a base 15A provided in a region between the first electrode 13 and the auxiliary electrode 14 and a rib 15B provided on the top face of the base 15A. The rib 15B enables to reduce the contact area between the projection structure 15 and the cover substrate 61 in the after-mentioned manufacturing step. Thus, the cover substrate 61 is stably laminated over the projection structure 15 with no gap between the projection structure 15 and the cover substrate 61. The rib 15B is formed over the whole area of the display region 110. The rib 15B may be formed uniformly on the top face of the base 15A (refer to FIG. 6). Otherwise, the rib 15B may be formed independently on part of the top face of the base 15A (refer to FIG. 3 and FIG. 5). The latter case includes a case in which the rib 15B is provided along the long side of the first electrode 13 as shown in FIG. 3 and a case in which the rib 15B is provided along the short side of the first electrode 13 as shown in FIG. 5. The former case includes a case in which the rib 15B is sequentially provided along the four sides of the first electrode 13 as shown in FIG. 6.

The organic layer 16 has, for example, a structure in which a hole injection layer, a hole transport layer, the light emitting layer, and an electron transport layer (all elements are not shown) are sequentially layered from the first electrode 13 side. Of the foregoing layers, the layers other than the light emitting layer may be provided according to need. Further, the organic layer 16 may have a structure different according to the light emitting color of the organic light emitting devices 10R, 10G, and 10B. The hole injection layer is intended to improve the hole injection efficiency and functions as a buffer layer to prevent leakage. The hole transport layer is intended to improve efficiency to transport a hole to the light emitting layer. The light emitting layer is intended to generate light due to electron-hole recombination by applying the electric field. The electron transport layer is intended to improve efficiency to transport electrons to the light emitting layer.

Materials for the hole injection layer of the organic light emitting device 10R include, for example, 4,4', 4"-tris (3-methylphenylphenylamino)triphenylamine (m-MTDATA) or 4,4', 4"-tris(2-naphthylphenylamino)triphenylamine (2-TNATA). Materials for the hole transport layer of the organic light emitting device 10R include, for example, bis[(N-naphthyl)-N-phenyl]benzidine (α-NPD). Materials for the light emitting layer of the organic light emitting device 10R include, for example, a material in which 30 wt % of 2,6=bis[4'=-methoxydiphenylamino)styryl]=1,5=dicyanonaphthalene (BSN) is mixed with 9,10-di-(2-naphthyl)anthracene (ADN). Materials for the electron transport layer of the organic light emitting device 10R include, for example, 8-hydroxyquinoline aluminum ($Alq_3$).

Materials for the hole injection layer of the organic light emitting device 10G include, for example, m-MTDATA or 2-TNATA. Materials for the hole transport layer of the organic light emitting device 10G include, for example, α-NPD. Materials for the light emitting layer of the organic light emitting device 10G include, for example, a material in which 5 volume % of coumarin 6 is mixed with ADN. Materials for the electron transport layer of the organic light emitting device 10G include, for example, $Alq_3$.

Materials for the hole injection layer of the organic light emitting device 10B include, for example, m-MTDATA or 2-TNATA. Materials for the hole transport layer of the organic light emitting device 10B include, for example, α-NPD. Materials for the light emitting layer of the organic light emitting device 10B include, for example, a material in which 2.5 wt % of 4,4'=bis[2={4=(N,N=diphenylamino) phenyl}vinyl]biphenyl (DPAVBi) is mixed with ADN. Materials for the electron transport layer of the organic light emitting device 10B include, for example, $Alq_3$.

The second electrode 17 is, for example, from 5 nm to 50 nm thick, and is made of a simple substance or an alloy of metal elements such as aluminum (Al), magnesium (Mg), calcium (Ca), and sodium (Na). Specially, an alloy of magnesium and silver (MgAg alloy) or an alloy of aluminum (Al) and lithium (Li) (AlLi alloy) is preferable. Further, the second electrode 17 may be made of ITO (indium tin composite oxide) or IZO (indium zinc composite oxide).

The display unit is manufactured, for example, as follows.

Figure 7:
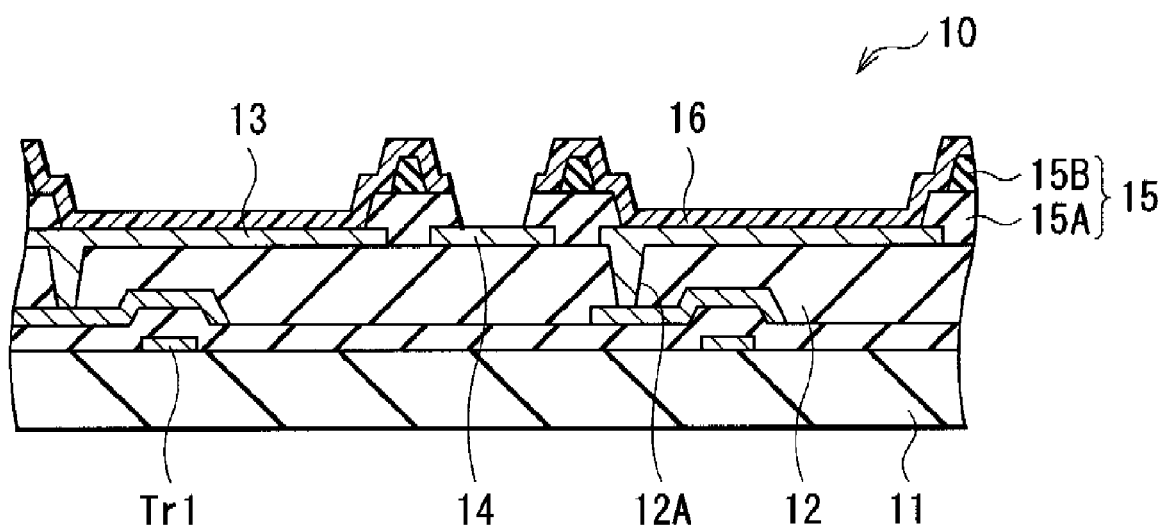
FIG. 7 is a cross section showing a method of manufacturing the display unit shown in FIG. 1 in the order of steps.
Figure 10A:
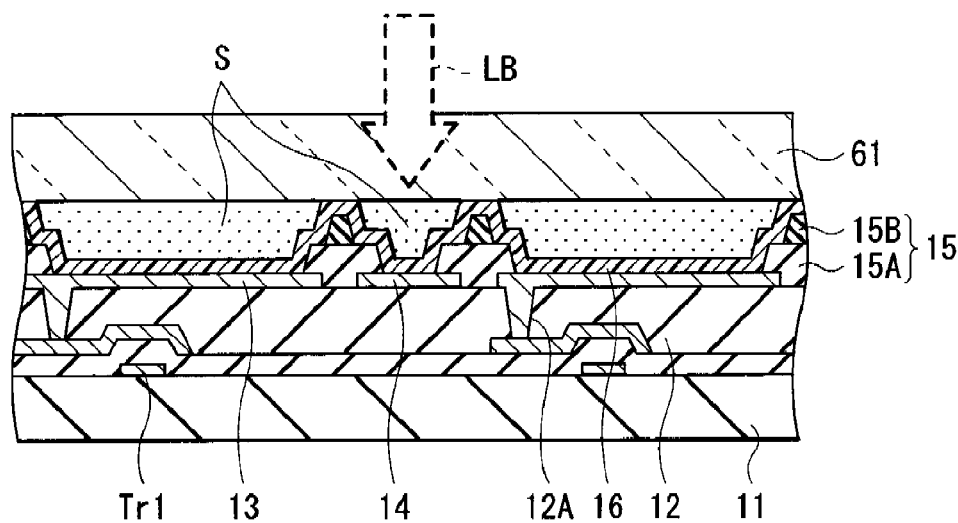
FIGS. 10A and 10B are views for explaining a step following FIGS. 8A, 8B, 9A, and 9B.
Figure 10B:
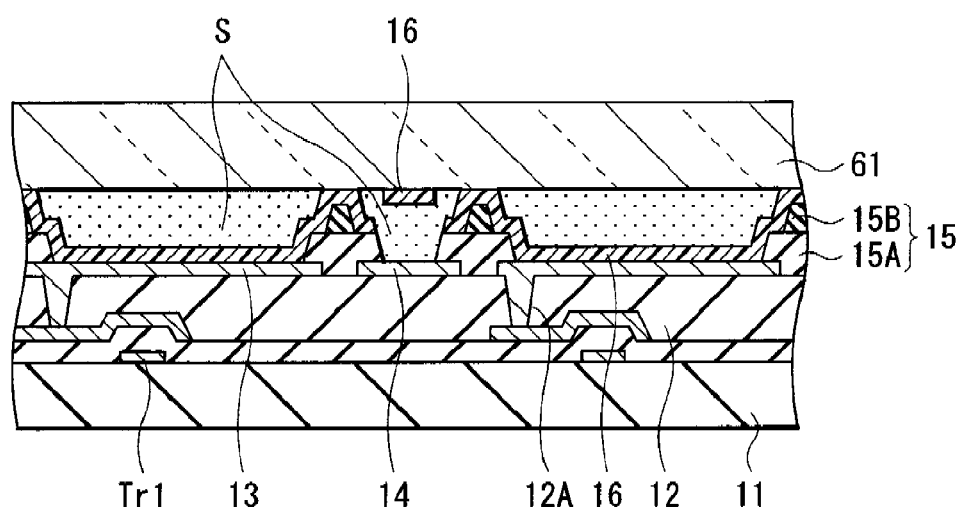

FIG. 7 to FIG. 12B show a method of manufacturing the display unit in the order of steps. First, as shown in FIG. 7, the substrate 11 made of the foregoing material is prepared, and the pixel driving circuit 140 including the driving transistor Tr1 is formed on the substrate 11. After that, the planarizing insulating film 12 is formed by, for example, coating the whole area with a photosensitive resin. Then, the planarizing insulating film 12 is patterned into a given shape by providing exposure and development. In addition, the connection hole 12A is formed, and the resultant is fired.

Next, as shown in FIG. 7 as well, the first electrode 13 made of the foregoing material is formed by, for example, sputtering method, and then is formed into a given shape by, for example, etching. Further, the foregoing auxiliary electrode 14 is formed by, for example, sputtering method, and then is formed into a given shape by, for example, etching. The first electrode 13 and the auxiliary electrode 14 may be formed into a film and formed into a given shape by etching in the same step. Further, the auxiliary electrode 14 may be made of a material different from that of the first electrode 13, formed into a film and formed into a given shape by etching in a different step.

Subsequently, as shown in FIG. 7 as well, the base 15A of the projection structure 15 made of the foregoing material is formed by, for example, photolithography method. Then, the opening corresponding to the light emitting region of the first electrode 13 and the auxiliary electrode 14 is provided.

After that, as shown in FIG. 7 as well, for example, the second photolithography is performed, and thereby the rib 15B made of a material similar to that of the base 15A is formed on the base 15A in the planar shape as shown in FIG. 3, FIG. 5, or FIG. 6. Thereby, the projection structure 15 having the two-stage structure composed of the base 15A and the rib 15B is formed.

After the projection structure 15 is formed, as shown in FIG. 7 as well, the organic layer 16 covering the first electrode 13 and the auxiliary electrode 14 is formed by a general film-forming method such as evaporation method, CVD (Chemical Vapor Deposition) method, print method, inkjet method, and transfer method. The organic layer 16 does not necessarily cover the whole area over the substrate 11, but may be pattern-formed for every respective organic light emitting devices 10R, 10G, and 10B. However, the organic layer 16 should cover the top face of the first electrode 13 totally. Thus, even if the organic layer 16 is pattern-formed, the organic layer 16 is extended to the projection structure 15 and the auxiliary electrode 14. Thereby, a device substrate 10 in which the first electrode 13, the auxiliary electrode 14, the projection structure 15, and the organic layer 16 are formed over the substrate 11 is formed.

After the device substrate 10 is formed, the portion of the organic layer 16 formed on the auxiliary electrode 14 is selectively removed, and thereby the auxiliary electrode 14 is exposed.

That is, first, as shown in FIG. 8A, the device substrate 10 and the cover substrate 61 are introduced into a chamber 50, and inside of the chamber 50 is maintained in the vacuum atmosphere. After that, in the vacuum atmosphere, the device substrate 10 is laminated over the cover substrate 61 with the projection structure 15 in between, and a laminated structure 62 is formed. At this time, the projection structure 15 becomes a spacer between the device substrate 10 and the cover substrate 61. Thus, even in the state that the device substrate 10 and the cover substrate 61 are laminated, the space S is generated between the device substrate 10 and the cover substrate 61.

The vacuum atmosphere is in a state of reduced pressure such as $10^{-1}$ Pa or less. The vacuum atmosphere also includes a state of reduced pressure such as reduced pressure nitrogen atmosphere and reduced pressure dry air atmosphere. In FIG. 8A to FIG. 11, FIG. 13, and FIG. 14, the vacuum atmosphere region is shown as a shaded region. The cover substrate 61 is made of, for example, a translucent material such as glass and plastic. The cover substrate 61 may be made of a plastic film as long as the plastic film has a rigidity with which space is secured between the cover substrate 61 and the device substrate 10 when the inside of the vacuum chamber 50 is maintained in the vacuum atmosphere.

After the laminated structure 62 is formed, the laminated structure 62 is taken out into the air in a state that the space S between the device substrate 10 and the cover substrate 61 is maintained in the vacuum atmosphere. It is not necessary to maintain the entire space S between the device substrate 10 and the cover substrate 61 in the vacuum atmosphere. It is enough that at least the space S that is located between the cover substrate 61 and the portion of the organic layer 16 formed on the auxiliary electrode 14 in the display region 110 is maintained in the vacuum atmosphere.

In the case where the space S is not communicated with outside of the laminated structure 62 in the state that the device substrate 10 is laminated over the cover substrate 61, the vacuum atmosphere in the space S is maintained even after the inside of the chamber 50 is returned to the state at normal pressures. Thus, the laminated structure 62 may be taken out of the chamber 50. Though not shown, the state that the space S is not communicated with outside of the laminated structure 62 is, for example, a case in which the rib 15B surrounds the outer circumference of the display region 110 with no gap. In addition, such a state may be a case in which as shown in FIG. 6, the rib 15B is sequentially provided along the four sides of the first electrode 13, and the rib 15B surrounds at least the space S that is located between the cover substrate 61 and the portion of the organic layer 16 formed on the auxiliary electrode 14 in the display region 110.

Meanwhile, when the space S is communicated with outside of the laminated structure 62 in the state that the device substrate 10 is laminated over the cover substrate 61, the laminated structure 62 is taken outside of the chamber 50 by using a jig 70 shown in FIG. 9A. The case that the space S is communicated with outside of the laminated structure 62 is, for example, as shown in FIG. 3 or FIG. 5, a case that the respective ribs 15B are independently formed and a gap exists in the outer circumference of the display region 110.

The jig 70 has a body 71 and a cover 72 made of, for example, stainless steel. The bottom face of the body 71 has a size capable of containing the laminated structure 62 kept in a horizontal position. The height of the side face of the body 71 is almost equal to the thickness of the laminated structure 62. The top face of the body 71 is opened to take out and put in the laminated structure 62. The cover 72 is attached to the upper end of the side face of the body 71. An airtight seal portion 73 is provided between the body 71 and the cover 72. The cover 72 is formed in a state of a frame having an opening 72A smaller than the laminated structure 62. An airtight seal portion 74 is provided between the cover 72 and the laminated structure 62.

The jig 70 is introduced into the chamber 50, and the laminated structure 62 is sandwiched and held between the body 71 and the cover 72 in the state that the inside of the chamber 50 is maintained in the vacuum atmosphere. Thereby, a gap between the body 71 and the cover 72 is hermetically sealed by the airtight seal portion 73, a gap between the cover 72 and the laminated structure 62 is hermetically sealed by the airtight seal portion 74, and thereby inside of the jig 70 becomes a state that the vacuum atmosphere is maintained. Therefore, the vacuum atmosphere in the space S between the device substrate 10 and the cover substrate 61 is maintained even after the inside of the chamber 50 is returned to the state at normal pressures. Thus, the laminated structure 62 sandwiched and held by the jig 70 may be taken out of the chamber 50.

After the laminated structure 62 is taken out of the chamber 50, as shown in FIG. 8B or FIG. 9B, a laser irradiation device 63 is arranged on the cover substrate 61 side, and infrared band laser light LB having a wavelength of 800 nm is emitted by, for example, a semiconductor CW (Continuous Wave) laser from, for example, the cover substrate 61 side to the laminated structure 62. Since the space S between the device substrate 10 and the cover substrate 61 is maintained in the vacuum atmosphere, even if the laser light LB is emitted to the laminated structure 62 taken out into the air, the laser light LB is emitted in the vacuum atmosphere to the portion of the organic layer 16 formed on the auxiliary electrode 14.

By irradiating the laser light LB in the vacuum atmosphere to the portion of the organic layer 16 formed on the auxiliary electrode 14, such a portion of the organic layer 16 formed on the auxiliary electrode 14 may be removed with the use of energy lower than that in the case that such a portion is removed in the air, and removal residue may be prevented. Further, thermal damage to the auxiliary electrode 14 and the adjacent organic light emitting devices 10R, 10G, and 10B due to irradiation of the laser light LB may be decreased.

Further, since the laser light LB is emitted to the laminated structure 62 in the air, compared to the case that laser is emitted through the glass window of the chamber in the past, the distance between the laser irradiation device 63 and the device substrate 10 may be relatively short, and the laser light LB having stable light condensing characteristics may be emitted. In addition, the equipment for irradiating the laser light is simplified, leading to cost reduction and capability of realizing a large substrate.

As described above, as shown in FIGS. 10A and 10B, the portion of the organic layer 16 formed on the auxiliary electrode 14 is sublimed, adhered again to the cover substrate 61, and then removed. Then, the cover substrate 61 is collected. Thereby, the material of the removed organic layer 16 is prevented from being adhered again to the device substrate 10, and the device is prevented from being contaminated. In the result, a high yield is realized.

As a method of irradiating the laser light LB, when the laser irradiation device 63 has a precise alignment mechanism, the laser light LB is selectively emitted to part or all of the auxiliary electrode 14. In this case, to secure the removal work, the width of the auxiliary electrode 14 may be formed large, considering the width of the laser light LB and the irradiation precision of the laser light LB.

Figure 11:
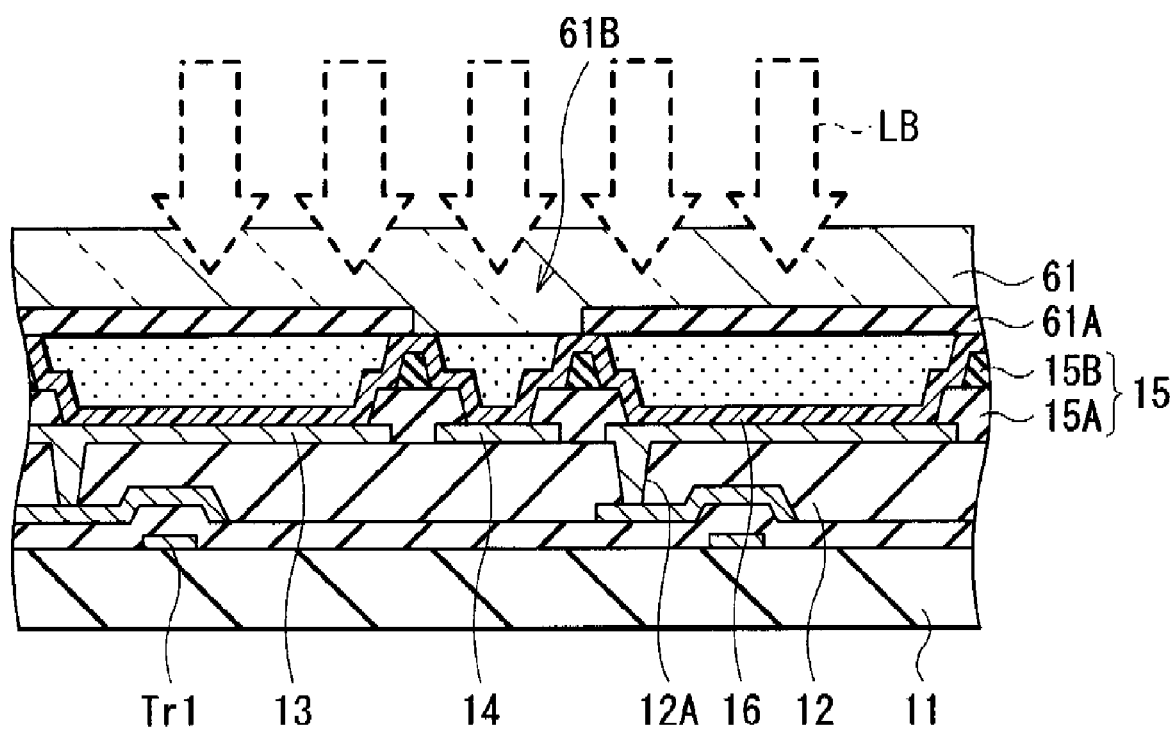
FIG. 11 is a view for explaining another example of the step shown in FIG. 10A.

Meanwhile, in the case where the laser irradiation device 63 does not have a precise alignment mechanism, as shown in FIG. 11, a shield film 61A having an opening 61B corresponding to the region to which the laser light LB is emitted is previously formed in the cover substrate 61. When the laminated structure 62 is formed, it is preferable that the opening 61B of the shield film 61A is precisely aligned with the auxiliary electrode 14 on the device substrate 10, and the laser light LB is emitted with the use of the cover substrate 61 as a mask. Thereby, the laser light LB is not necessarily emitted precisely, and thus, for example, the laser light LB may be emitted at a time. The shield film 61A is, for example, 100 nm or more thick, and is made of a simple substance or an alloy of metal elements such as aluminum (Al), chromium (Cr), titanium (Ti), nickel (Ni), and molybdenum (Mo). The opening 61B is provided by photolithography step or the like.

Figure 12A:
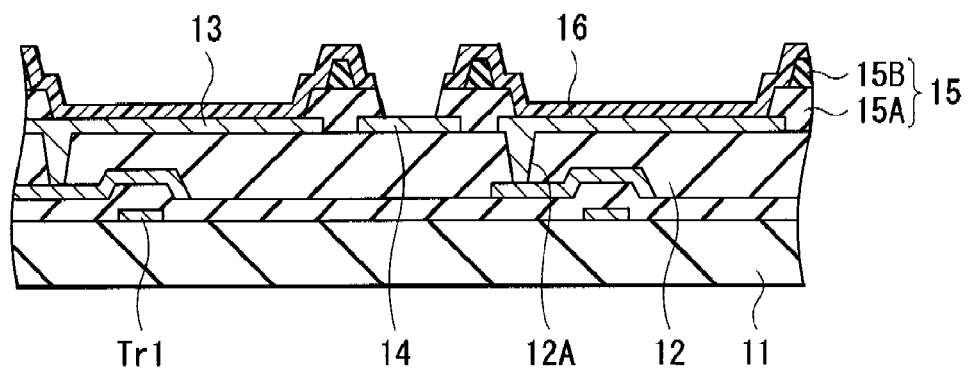
FIGS. 12A and 12B are views for explaining a step following FIGS. 10A, 10B, and 11.

After the portion of the organic layer 16 formed on the auxiliary electrode 14 is removed, the laminated structure 62 is conveyed to the chamber 50 again. After the inside of the chamber 50 is maintained in the vacuum atmosphere, the cover 72 is separated. Then, as shown in FIG. 12A, the cover substrate 61 is separated from the device substrate 10. Though the step of separating the device substrate 10 from the cover substrate 61 may be performed in the air as well, such a step is desirably performed in the vacuum atmosphere to retain the device characteristics.

Figure 12B:
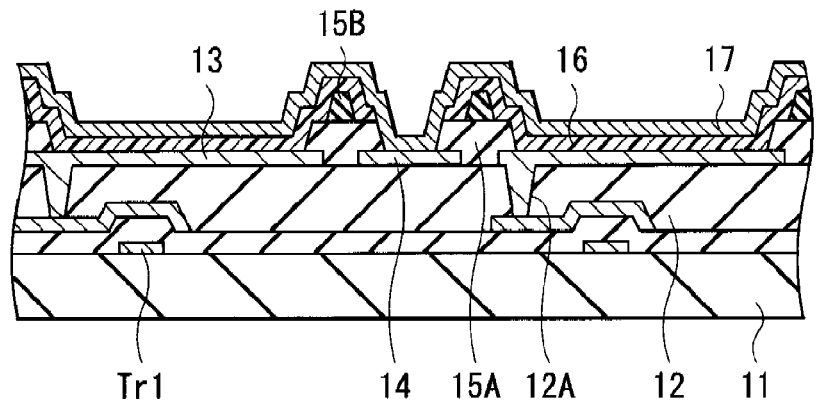

After the device substrate 10 is separated from the cover substrate 61, as shown in FIG. 12B, the second electrode 17 is formed on the organic layer 16 and the auxiliary electrode 14 by, for example, evaporation method, sputtering method, or CVD method. Thereby, the exposed portion of the auxiliary electrode 14 is electrically connected to the second electrode 17. After that, according to need, the protective film made of the foregoing material is formed on the second electrode 17 by, for example, evaporation method, sputtering method, or CVD method. The sealing substrate is bonded to the protective film with the adhesive layer in between. Consequently, the display unit shown in FIG. 1 is completed.

In the display unit, a scanning signal is supplied from the scanning line driving circuit 130 to each pixel through the gate electrode of the writing transistor Tr2. An image signal from the signal line driving circuit 120 is retained in the retention capacity Cs through the writing transistor Tr2. That is, the driving transistor Tr1 is on/off-controlled according to the signal retained in the retention capacity Cs. Thereby, driving current Id is injected into the respective organic light emitting devices 10R, 10G, and 10B. In the result, electron-hole recombination occurs, and thereby light is emitted. The light is extracted through the second electrode 17, the protective film, and the sealing substrate. In this embodiment, the portion of the organic layer 16 formed on the auxiliary electrode 14 is removed by laser irradiation in the vacuum atmosphere. Thus, the removal residue is low, and the electrical connection between the auxiliary electrode 14 and the second electrode 17 is favorable. Therefore, a current supplied from the power source (not shown) is flown to the respective organic light emitting devices 10R, 10G, and 10B through the auxiliary electrode 14 without generating a large difference in voltage drop. In the result, an image with uniform luminance is displayed over the entire screen.

As above, in this embodiment, in the step of selectively removing the portion of the organic layer 16 formed on the auxiliary electrode 14, the laminated structure 62 is formed by placing the cover substrate 61 over the device substrate 10 with the protrusion structure 15 in between in the vacuum atmosphere, the laminated structure 62 is taken out into the air in the state that the space S between the device substrate 10 and the cover substrate 61 is maintained in the vacuum atmosphere, and then the laser light LB is emitted to the laminated structure 62. Therefore, the portion of the organic layer 16 formed on the auxiliary electrode 14 may be removed by laser irradiation in the vacuum atmosphere.

Figure 13:
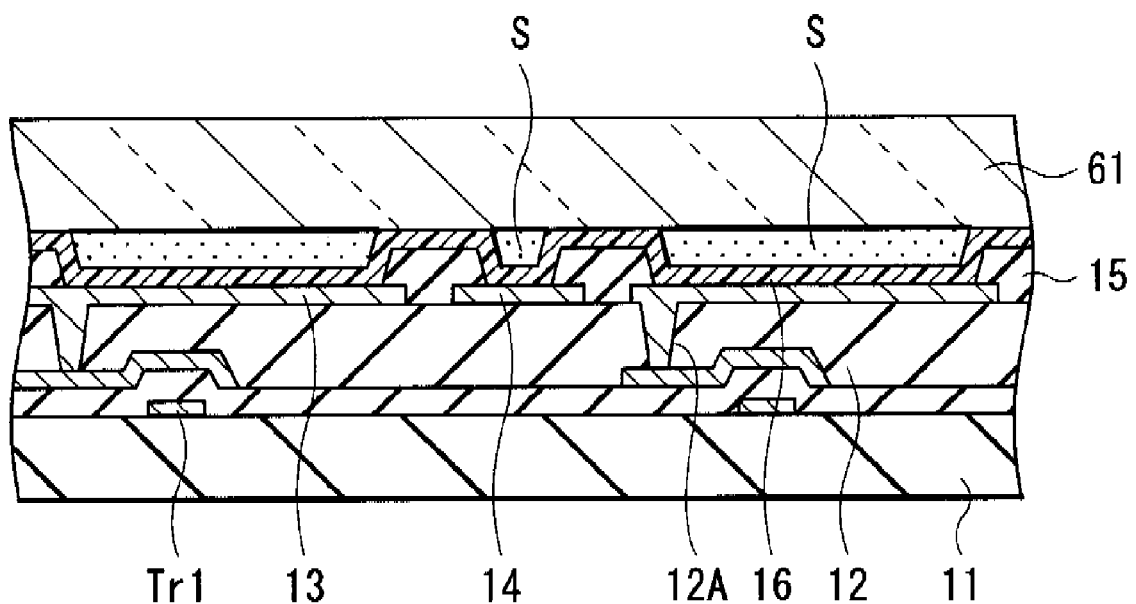
FIG. 13 is a cross section showing another structure of the organic light emitting device shown in FIG. 1.

In the foregoing embodiment, the description has been given of the case that the projection structure 15 has the two-stage structure composed of the base 15A and the rib 15B. However, the projection structure 15 does not necessarily have the rib 15B. As shown in FIG. 13, the projection structure 15 may be composed of only the base 15A. Thereby, the projection structure 15 may be formed by one time photolithography step, and the manufacturing step is further simplified. In this case, the height H of the projection structure 15 is preferably, for example, 2 μm or more from the front face of the first electrode and the front face of the auxiliary electrode 14.

Figure 14:
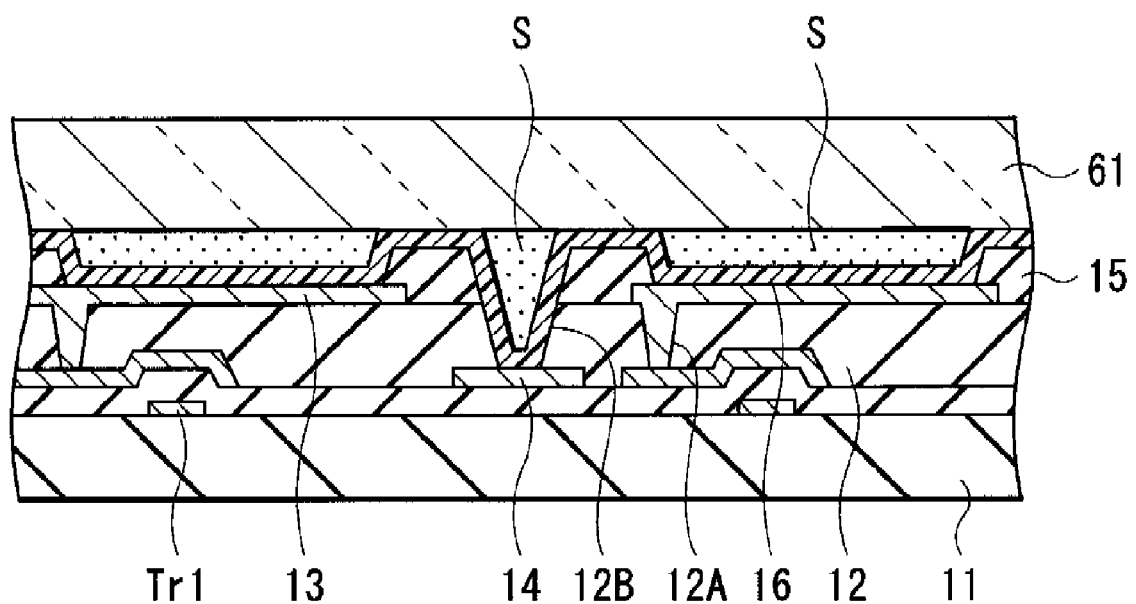
FIG. 14 is a cross section showing still another structure of the organic light emitting device shown in FIG. 1.

Further, in the foregoing embodiment, the description has been given of the case that the first electrode 13 and the auxiliary electrode 14 are formed on the planarizing insulating film 12. However, as shown in FIG. 14, as the pixel driving circuit 140 including the driving transistor Tr1, the auxiliary electrode 14 may be formed on the substrate 11, and may be connected to the second electrode 17 through a connection hole 12B provided in the planarizing insulating film 12.

MODULE AND APPLICATION EXAMPLES

A description will be given of application examples of the display unit described in the foregoing embodiment. The display unit of the foregoing embodiment is applicable to a display unit of an electronic device in any field for displaying an image signal inputted from outside or an image signal generated inside as an image or a picture, such as a television device, a digital camera, a notebook personal computer, a portable terminal device such as a mobile phone, and a video camera.

Module

Figure 15:
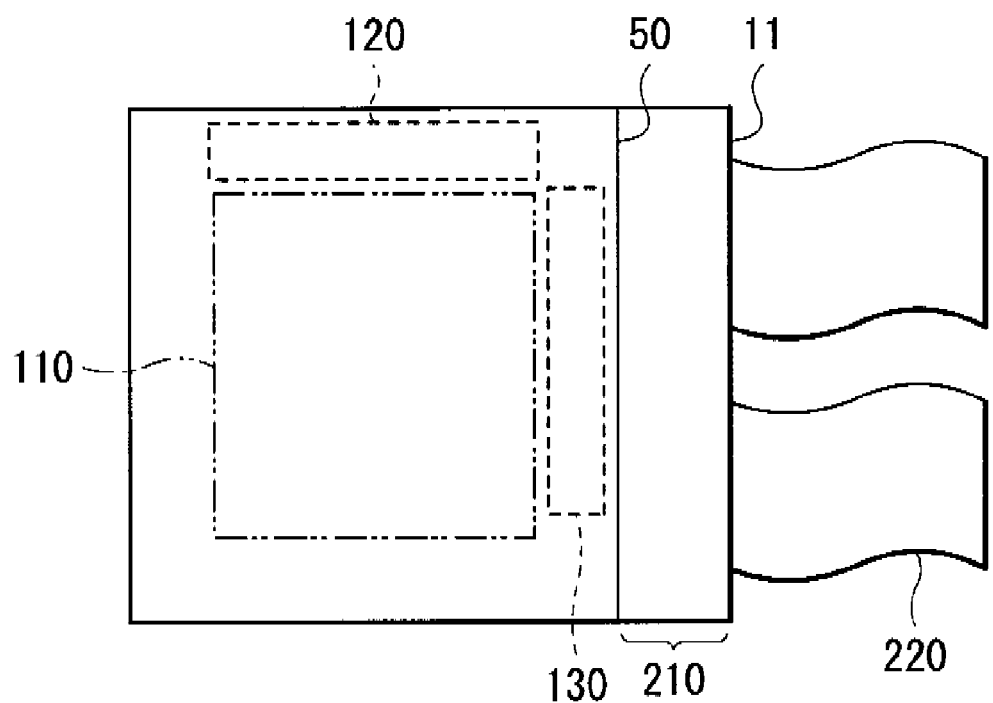
FIG. 15 is a plan view showing a schematic structure of a module including the display unit of the foregoing embodiment.

The display unit of the foregoing embodiment is incorporated in various electronic devices such as after-mentioned first to fifth application examples as a module as shown in FIG. 15, for example. In the module, for example, a region 210 exposed from a sealing substrate 30 and an adhesive layer 20 is provided on a side of the substrate 11, and an external connection terminal (not shown) is formed in the exposed region 210 by extending the wirings of the signal line driving circuit 120 and the scanning line driving circuit 130. The external connection terminal may be provided with a Flexible Printed Circuit (FPC) 220 for inputting and outputting a signal.

First Application Example

Figure 16:
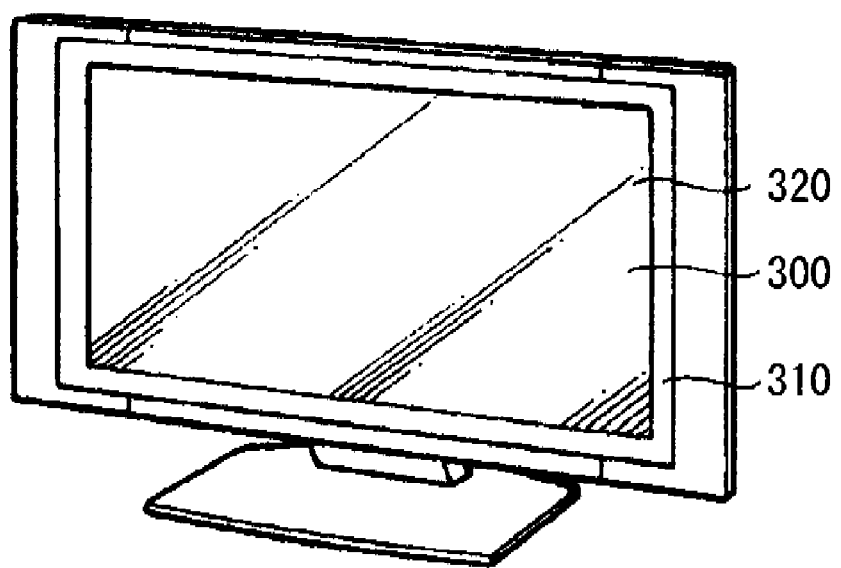
FIG. 16 is a perspective view showing an appearance of a first application example of the display unit of the foregoing embodiment.

FIG. 16 is an appearance of a television device to which the display unit of the foregoing embodiment is applied. The television device has, for example, an image display screen section 300 including a front panel 310 and a filter glass 320. The image display screen section 300 is composed of the display unit according to the foregoing embodiment.

Second Application Example

Figure 17A:
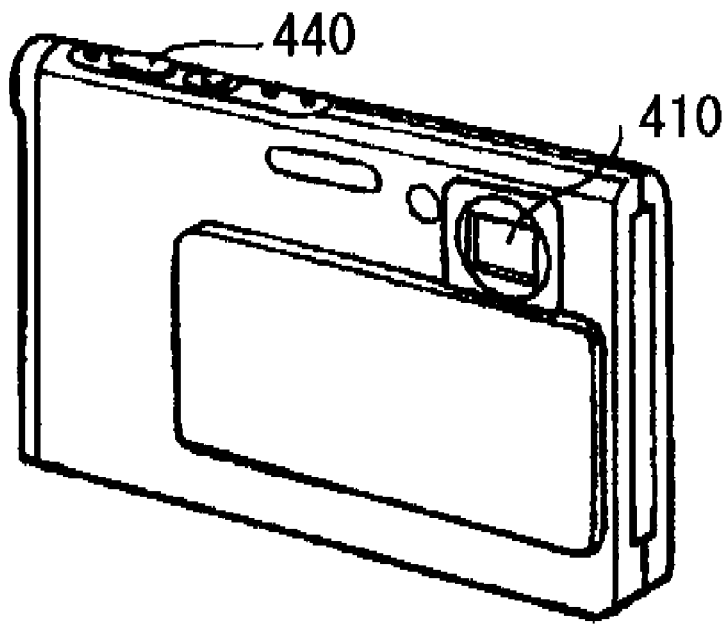
FIG. 17A is a perspective view showing an appearance viewed from the front side of a second application example.
Figure 17B:
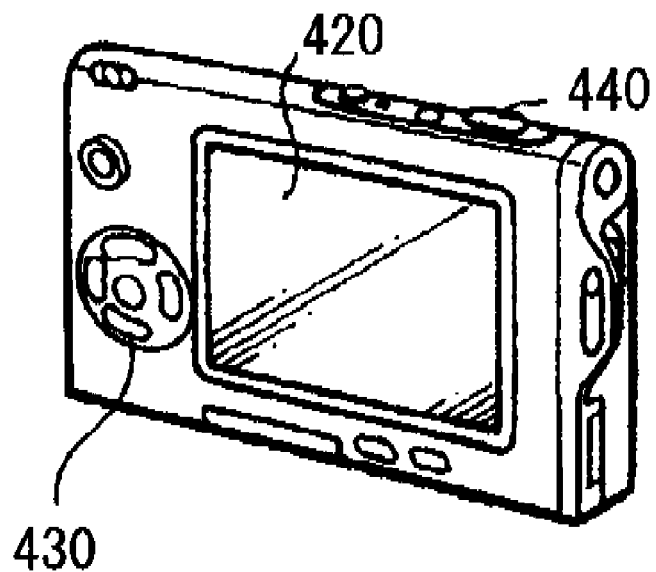
FIG. 17B is a perspective view showing an appearance viewed from the rear side of the second application example.

FIGS. 17A and 17B are an appearance of a digital camera to which the display unit of the foregoing embodiment is applied. The digital camera has, for example, a light emitting section for a flash 410, a display section 420, a menu switch 430, and a shutter button 440. The display section 420 is composed of the display unit according to the foregoing embodiment.

Third Application Example

Figure 18:
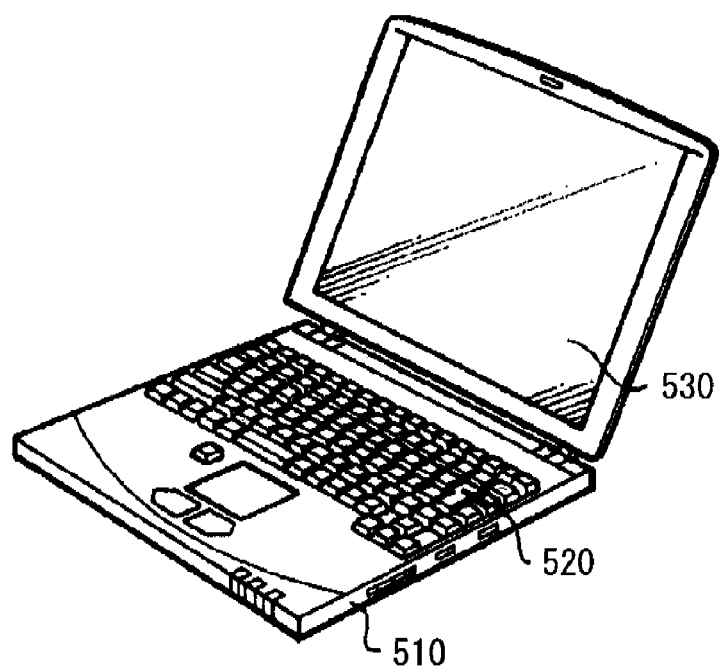
FIG. 18 is a perspective view showing an appearance of a third application example.

FIG. 18 is an appearance of a notebook personal computer to which the display unit of the foregoing embodiment is applied. The notebook personal computer has, for example, a main body 510, a keyboard 520 for operation of inputting characters and the like, and a display section 530 for displaying an image. The display section 530 is composed of the display unit according to the foregoing embodiment.

Fourth Application Example

Figure 19:
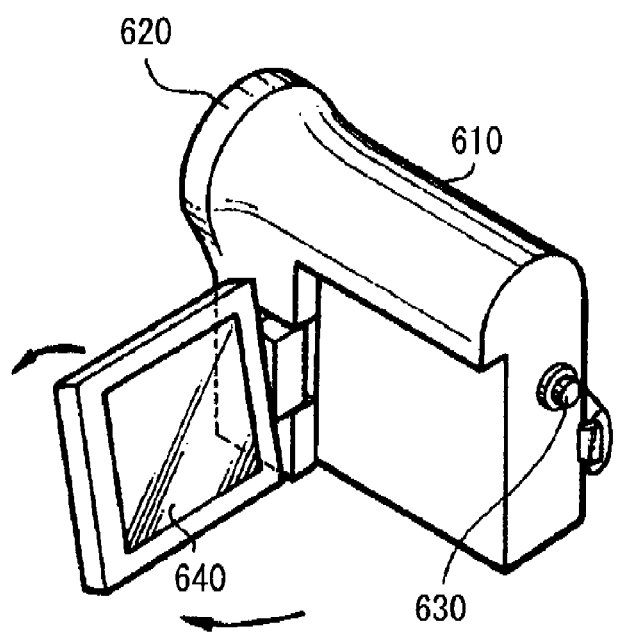
FIG. 19 is a perspective view showing an appearance of a fourth application example.
Figure 20:
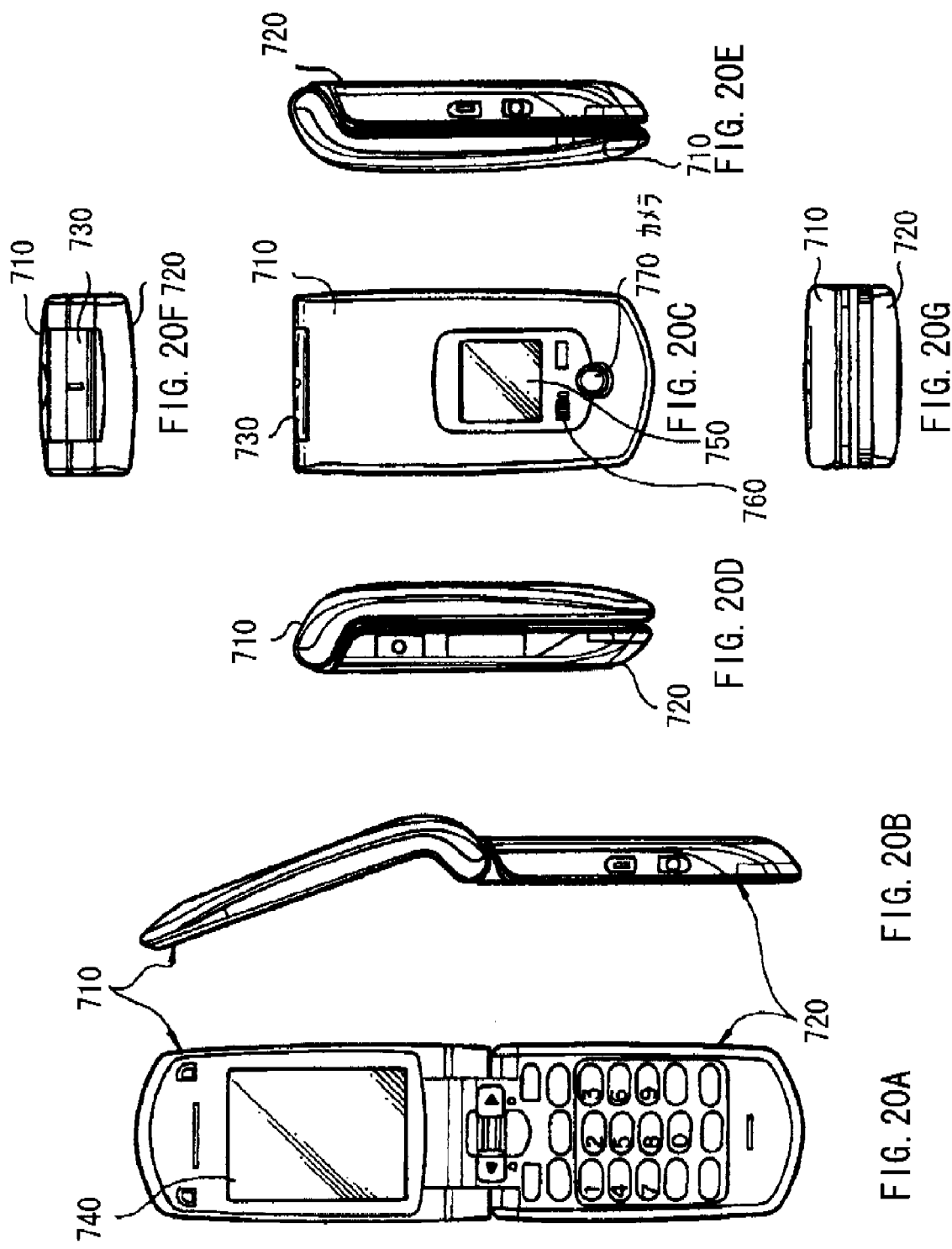
FIG. 20A is an elevation view of a fifth application example unclosed.
FIG. 20B is a side view thereof.
FIG. 20C is an elevation view of the fifth application example closed.
FIG. 20D is a left side view thereof.
FIG. 20E is a right side view thereof.
FIG. 20F is a top view thereof.
FIG. 20G is a bottom view thereof.
Figure 21:
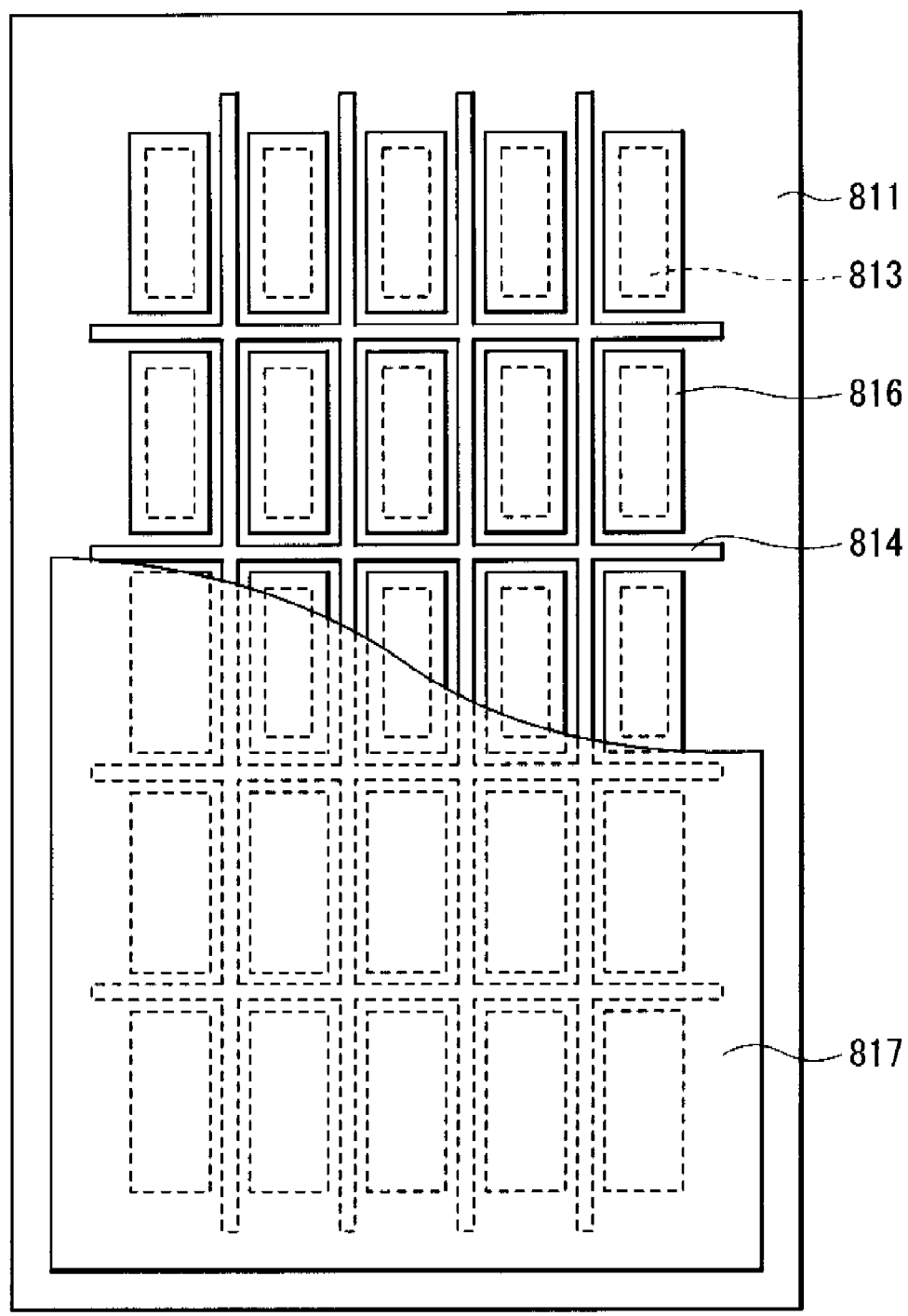
FIG. 21 is a plan view showing a configuration of a display unit of the related art having an organic light emitting device.

FIG. 19 is an appearance of a video camera to which the display unit of the foregoing embodiment is applied. The video camera has, for example, a main body 610, a lens for shooting an object 620 provided on the front side face of the main body 610, a start/stop switch in shooting 630, and a display section 640. The display section 640 is composed of the display unit according to the foregoing embodiment.

Fifth Application Example

FIGS. 20A to 20G are an appearance of a mobile phone to which the display unit of the foregoing embodiment is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing embodiment.

While the invention has been described with reference to the embodiment, the invention is not limited to the foregoing embodiment, and various modifications may be made. For example, the material, the thickness, the film-forming method, the film-forming conditions, and laser light irradiation conditions and the like of each layer are not limited to those described in the foregoing embodiment, but other material, other thickness, other film-forming method, other film-forming conditions, and other irradiation conditions may be adopted. For example, the first electrode 13 may be made of ITO or IZO (indium zinc composite oxide). Further, the first electrode 13 may have a dielectric multilayer film.

In addition, for example, in the foregoing embodiment, the description has been given of the case in which the first electrode 13, the organic layer 16, and the second electrode 17 are layered in this order from the substrate 11 side over the substrate 11, and the light is extracted from the sealing substrate side. However, it is possible that the lamination order is reversed. That is, it is possible that the second electrode 17, the organic layer 16, and the first electrode 13 are sequentially layered from the substrate 11 side over the substrate 11, and the light is extracted from the substrate 11 side.

Furthermore, for example, in the foregoing embodiment, the description has been given of the case in which the first electrode 13 is used as an anode and the second electrode 17 is used as a cathode. However, it is possible that the anode and the cathode are reversed. That is, it is possible that the first electrode 13 is used as a cathode and the second electrode 17 is used as an anode. Further, it is possible that the first electrode 13 is used as a cathode and the second electrode 17 is used as an anode, and the second electrode 17, the organic layer 16, and the first electrode 13 are sequentially layered from the substrate 11 side over the substrate 11, and the light is extracted from the substrate 11 side.

In addition, in the foregoing embodiment, the description has been specifically given of the structure of the organic light emitting devices 10R, 10G, and 10B. However, it is not necessary to provide all layers, and other layer may be further provided. For example, an hole injection thin film layer made of chromium oxide (III) ($Cr_2O_3$), ITO (Indium-Tin Oxide: oxide mixed film of Indium (In) and tin (Sn)) or the like may be provided between the first electrode 13 and the organic layer 16.

Furthermore, in the foregoing embodiment, the description has been given of the case in which the second electrode 17 is made of the translucent electrode, and the light generated in the light emitting layer is extracted from the second electrode 17 side. However, the generated light may be extracted from the first electrode 13 side. In this case, it is desirable that the second electrode 17 has reflectance as high as possible to improve the light emitting efficiency.

In addition, in the foregoing embodiment, the description has been given of the active matrix display unit. However, the invention is also applicable to a passive matrix display unit. Furthermore, the structure of the pixel driving circuit for the active matrix driving is not limited to the structure described in the foregoing respective embodiment. If necessary, a capacity device or a transistor may be added. In this case, according to the change of the pixel driving circuit, a necessary driving circuit may be added in addition to the foregoing signal line driving circuit 120 and the scanning line driving circuit 130.

It should be understood by those skilled in the art that various modifications, combination, sub-combinations and alternations may occur depending on design requirements and other factors insofar as they are within the scope of the appended claims or the equivalents thereof.

What is claimed is:

1. A method of manufacturing a display unit having a plurality of organic light emitting devices on a substrate, the method comprising the steps of:
   (a) forming a device substrate by forming a plurality of first electrodes, an auxiliary electrode in a region between the plurality of first electrodes, a projection structure made of an insulating material in a region between the plurality of first electrodes and the auxiliary electrode, and an organic layer covering the plurality of first electrodes and the auxiliary electrode over the substrate;
   (b) selectively removing a portion of the organic layer formed on the auxiliary electrode; and
   (c) forming a second electrode on the organic layer and the auxiliary electrode,
   wherein, the step of selectively removing the portion of the organic layer formed on the auxiliary electrode includes the steps of:
   (b1) first forming, prior to a removal of the portion of the organic layer formed on the auxiliary electrode, a laminated structure that includes a cover substrate and the device substrate by placing the cover substrate over the device substrate with the projection structure in between in the vacuum atmosphere,
   (b2) after the step of forming the laminated structure, taking out the laminated structure into the air in a state such that at least a space between the cover substrate and the portion of the organic layer formed on the auxiliary electrode is maintained in the vacuum atmosphere prior to the removal of the portion of the organic layer formed on the auxiliary electrode,
   (b3) thereafter, while at least the space between the cover substrate and the portion of the organic layer formed on the auxiliary electrode is being maintained in the vacuum atmosphere, irradiating laser light to the laminated structure on a cover substrate side so as to remove the portion of the organic layer formed on the auxiliary electrode, the auxiliary electrode being under the cover substrate while the laser light is being irradiated to remove the portion of the organic layer formed on the auxiliary electrode in the vacuum atmosphere, and
   (b4) separating the cover substrate and the device substrate after the portion of the organic layer formed on the auxiliary electrode is removed with the laser light.

2. The method of manufacturing a display unit according to claim 1, wherein the projection structure comprises:
   a base provided in the region between the plurality of first electrodes and the auxiliary electrode; and
   a rib provided on part of a top face of the base.

3. The method of manufacturing a display unit according to claim 1, wherein the cover substrate includes a shielding film having an opening corresponding to a region to which the laser light is emitted.

* * * * *